US011832519B2

(12) United States Patent
Hirose et al.

(10) Patent No.: US 11,832,519 B2
(45) Date of Patent: Nov. 28, 2023

(54) THERMOELECTRIC CONVERSION MATERIAL, THERMOELECTRIC CONVERSION ELEMENT, THERMOELECTRIC CONVERSION MODULE, AND OPTICAL SENSOR

(71) Applicants: Sumitomo Electric Industries, Ltd., Osaka (JP); Toyota School Foundation, Nagoya (JP)

(72) Inventors: Kotaro Hirose, Osaka (JP); Masahiro Adachi, Osaka (JP); Tsunehiro Takeuchi, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 143 days.

(21) Appl. No.: 17/637,805

(22) PCT Filed: Sep. 16, 2020

(86) PCT No.: PCT/JP2020/035045
§ 371 (c)(1),
(2) Date: Feb. 24, 2022

(87) PCT Pub. No.: WO2021/060101
PCT Pub. Date: Apr. 1, 2021

(65) Prior Publication Data
US 2022/0285602 A1    Sep. 8, 2022

(30) Foreign Application Priority Data
Sep. 25, 2019    (JP) .................... 2019-174467

(51) Int. Cl.
*H10N 10/851*    (2023.01)
*C22C 28/00*    (2006.01)
(Continued)

(52) U.S. Cl.
CPC .......... *H10N 10/851* (2023.02); *C22C 28/00* (2013.01); *C22C 45/00* (2013.01); *H10N 10/857* (2023.02); *C22C 2200/02* (2013.01)

(58) Field of Classification Search
CPC ............... H10N 10/851; H10N 10/857; H10N 10/8556; H10N 10/855; C22C 45/00; C22C 28/00; C22C 2200/02
See application file for complete search history.

(56) References Cited

U.S. PATENT DOCUMENTS

| 4,447,277 A * | 5/1984 | Jayadev ............... H10N 10/853 420/580 |
| 2004/0031515 A1* | 2/2004 | Sadatomi ............. H10N 10/855 136/239 |

(Continued)

FOREIGN PATENT DOCUMENTS

| JP | 2010129636 A | * 6/2010 |
| JP | 2015-135939 A | 7/2015 |

(Continued)

OTHER PUBLICATIONS

JP-2010129636-A English machine translation (Year: 2010).*

(Continued)

*Primary Examiner* — Andrew J Golden
(74) *Attorney, Agent, or Firm* — XSENSUS LLP

(57) ABSTRACT

A thermoelectric conversion material is constituted of a semiconductor that contains a constituent element and an additive element having a difference of 1 in the number of electrons in an outermost shell from the constituent element, the additive element having a concentration of not less than 0.01 at % and not more than 30 at %. The semiconductor has a microstructure including an amorphous phase and a granular crystal phase dispersed in the amorphous phase. The amorphous phase includes a first region in which the concentration of the additive element is a first concentration, (Continued)

and a second region in which the concentration of the additive element is a second concentration lower than the first concentration. The first concentration and the second concentration have a difference of not less than 15 at % and not more than 25 at % therebetween.

9 Claims, 6 Drawing Sheets

(51) Int. Cl.
*C22C 45/00* (2023.01)
*H10N 10/857* (2023.01)

(56) References Cited

U.S. PATENT DOCUMENTS

| | | | |
|---|---|---|---|
| 2005/0172994 A1* | 8/2005 | Shutoh | H10N 10/854 136/239 |
| 2015/0122302 A1 | 5/2015 | Sawa | |
| 2016/0300992 A1* | 10/2016 | Rhyee | H10N 10/852 |
| 2016/0300994 A1 | 10/2016 | Adachi et al. | |
| 2019/0198742 A1 | 6/2019 | Adachi | |

FOREIGN PATENT DOCUMENTS

| | | |
|---|---|---|
| JP | 2017-216388 A | 12/2017 |
| WO | 2014/014126 A1 | 1/2014 |

OTHER PUBLICATIONS

Nishino et al., "Thermoelectric Properties of Nanograined Si—Ge—Au Thin Films Grown by Molecular Beam Deposition", Journal of Electronic Materials, 2018, vol. 47, 6 pages.

* cited by examiner

THERMOELECTRIC CONVERSION MATERIAL, THERMOELECTRIC CONVERSION ELEMENT, THERMOELECTRIC CONVERSION MODULE, AND OPTICAL SENSOR

CROSS-REFERENCE TO RELATED APPLICATIONS

The present application is based on PCT/JP2020/035045 filed on Sep. 16, 2020, and claims priority to Japanese Application No. 2019-174467, filed on Sep. 25, 2019, the entire contents of each are incorporated herein by reference.

TECHNICAL FIELD

The present disclosure relates to a thermoelectric conversion material, a thermoelectric conversion element, a thermoelectric conversion module, and an optical sensor.

BACKGROUND ART

In recent years, renewable energy has been drawing attention as clean energy to replace fossil fuels such as petroleum. Renewable energy includes energy obtained through power generation using solar light, hydraulic power, and wind power, as well as energy obtained through power generation by thermoelectric conversion using a temperature difference. In the thermoelectric conversion, heat is directly converted into electric power, so no extra waste is discharged during the conversion. A power generation device utilizing the thermoelectric conversion requires no motor or other drive unit, offering advantages such as easy maintenance of the device.

Efficiency $\eta$ in converting a temperature difference (heat energy) into electric energy using a material (thermoelectric conversion material) for thermoelectric conversion is given by the following expression (1).

$$\eta = \Delta T/T_h \cdot (M-1)/(M+T_c/T_h) \quad (1)$$

Here, $\eta$ represents a conversion efficiency, $\Delta T$ represents a difference between $T_h$ and $T_c$, $T_h$ represents a temperature on the high temperature side, $T_c$ represents a temperature on the low temperature side. M equals $(1+ZT)^{1/2}$, ZT equals $\alpha^2 ST/\kappa$, ZT represents a dimensionless figure of merit, $\alpha$ represents a Seebeck coefficient, S represents an electrical conductivity, T represents a temperature, and $\kappa$ represents a thermal conductivity. The conversion efficiency is a monotonically increasing function of ZT. It is important to increase ZT in developing a thermoelectric conversion material.

A technique of using Si, Ge, and Au for a thermoelectric conversion material has been reported (for example, Non Patent Literature 1). Patent Literature 1 discloses a thermoelectric conversion material that includes nanoparticles in a semiconductor material composed of a constituent element, each nanoparticle containing the constituent element and a heterogeneous element different from the constituent element.

CITATION LIST

Patent Literature

Patent Literature 1: Japanese Patent Application Laid-Open No. 2015-135939

Non Patent Literature

Non Patent Literature 1: Shunsuke Nishino et al., "Thermoelectric Properties of Nanograined Si—Ge—Au Thin Films Grown by Molecular Beam Deposition", Journal of ELECTRONIC MATERIALS 47(2018) 3267

SUMMARY OF INVENTION

A thermoelectric conversion material according to the present disclosure is a semiconductor that contains a constituent element and an additive element having a difference of 1 in the number of electrons in an outermost shell from the constituent element, the additive element having a concentration of not less than 0.01 at % and not more than 30 at %. The semiconductor has a microstructure including an amorphous phase and a granular crystal phase dispersed in the amorphous phase. The amorphous phase includes a first region in which the concentration of the additive element is a first concentration, and a second region in which the concentration of the additive element is a second concentration lower than the first concentration. The first concentration and the second concentration have a difference of not less than 15 at % and not more than 25 at % therebetween.

DESCRIPTION OF EMBODIMENTS

Figure 1:
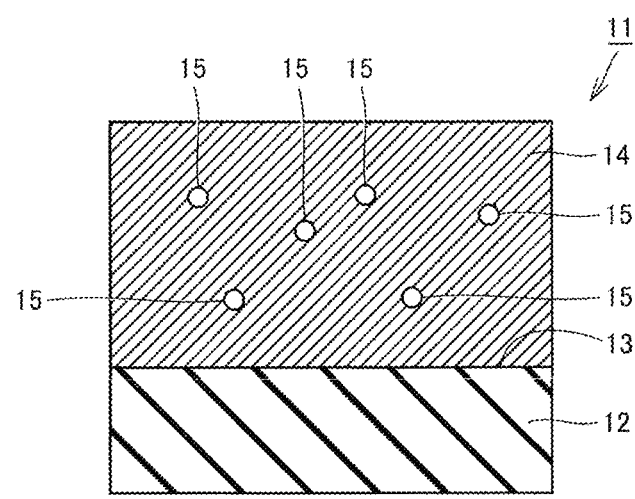
FIG. 1 is a schematic cross-sectional view showing a portion of a thermoelectric conversion material according to Embodiment 1 of the present disclosure.

Problems to be Solved by the Present Disclosure

There has been required a thermoelectric conversion material having a high conversion efficiency. If ZT can be increased, the efficiency of thermoelectric conversion can be improved. Lowering the thermal conductivity $\kappa$ can increase the ZT.

In view of the foregoing, one of the objects of the present disclosure is to provide a thermoelectric conversion material, a thermoelectric conversion element, a thermoelectric conversion module, and an optical sensor having an increased ZT with a lowered thermal conductivity.

Advantageous Effects of the Present Disclosure

According to the thermoelectric conversion material described above, ZT can be increased with the thermal conductivity lowered.

DESCRIPTION OF EMBODIMENTS OF THE PRESENT DISCLOSURE

Firstly, embodiments of the present disclosure will be listed and described. A thermoelectric conversion material according to the present disclosure is constituted of a semiconductor that contains a constituent element and an additive element having a difference of 1 in the number of electrons in an outermost shell from the constituent element, the additive element having a concentration of not less than 0.01 at % and not more than 30 at %. The semiconductor has a microstructure including an amorphous phase and a granular crystal phase dispersed in the amorphous phase. The amorphous phase includes a first region in which the concentration of the additive element is a first concentration, and a second region in which the concentration of the additive element is a second concentration lower than the first concentration. The first concentration and the second concentration have a difference of not less than 15 at % and not more than 25 at % therebetween.

In the thermoelectric conversion material of the present disclosure, the microstructure of the semiconductor includes the granular crystal phase. With this, the thermoelectric conversion material has a high electrical conductivity. The amorphous phase includes the first region and the second region that differ in concentration of the additive element. Such unevenness in composition of the additive element in the semiconductor microstructure can cause phonon scattering, thereby reducing the thermal conductivity. The above-described thermoelectric conversion material can reduce the thermal conductivity while maintaining the improvement of the electrical conductivity by virtue of the inclusion of the granular crystal phase. Accordingly, the above-described thermoelectric conversion material can improve the efficiency of thermoelectric conversion.

In the thermoelectric conversion material described above, the constituent element may include a first constituent element and a second constituent element. A ratio of a concentration of atoms of the first constituent element to all the constituent elements in the first region and a ratio of a concentration of atoms of the first constituent element to all the constituent elements in the second region may have a difference of not less than 5% and not more than 10%. With this configuration, the unevenness in composition of the constituent elements in the semiconductor microstructure can cause phonon scattering, thereby reducing the thermal conductivity. Accordingly, the efficiency of thermoelectric conversion can be improved.

In the thermoelectric conversion material described above, the first region may have an equivalent circle diameter of not less than 3 nm and not more than 40 nm. This can reliably reduce the thermal conductivity while maintaining a high electrical conductivity. Accordingly, the efficiency of thermoelectric conversion can be improved reliably.

In the thermoelectric conversion material described above, the constituent element may include at least one of silicon (Si) and germanium (Ge). Such a constituent element is suitable as the constituent element for the thermoelectric conversion material.

In the thermoelectric conversion material described above, the additive element may include at least one of antimony (Sb), aluminum (Al), phosphorus (P), arsenic (As), and nitrogen (N). Such an additive element is suitably used as the additive element for the constituent element above.

In the Thermoelectric Conversion Material Described Above, the Concentration of the additive element may be not less than 5 at % and not more than 25 at %. With this, a thermoelectric conversion material with improved efficiency of thermoelectric conversion can be obtained more reliably.

A thermoelectric conversion element of the present disclosure includes: a thermoelectric conversion material portion; a first electrode disposed in contact with the thermoelectric conversion material portion; and a second electrode disposed in contact with the thermoelectric conversion material portion and apart from the first electrode. The thermoelectric conversion material portion is constituted by the above-described thermoelectric conversion material of the present disclosure which has p type or n type conductivity.

In the thermoelectric conversion element of the present disclosure, the material constituting the thermoelectric conversion material portion is the above-described thermoelectric conversion material having excellent thermoelectric conversion characteristics, which has p type or n type conductivity. Therefore, a thermoelectric conversion element excellent in conversion efficiency can be provided.

A thermoelectric conversion module of the present disclosure includes the above-described thermoelectric conversion element. According to the thermoelectric conversion module of the present disclosure, with the inclusion of the thermoelectric conversion element of the present disclosure excellent in efficiency of thermoelectric conversion, a thermoelectric conversion module with improved efficiency of thermoelectric conversion can be obtained.

An optical sensor of the present disclosure includes: an absorber that absorbs optical energy; and a thermoelectric conversion material portion connected to the absorber. The thermoelectric conversion material portion is constituted by the above-described thermoelectric conversion material of the present disclosure which has p type or n type conductivity.

In the optical sensor of the present disclosure, the material constituting the thermoelectric conversion material portion is the above-described thermoelectric conversion material excellent in thermoelectric conversion characteristics and having p type or n type conductivity. Therefore, an optical sensor of high sensitivity can be provided.

DETAILS OF EMBODIMENTS OF THE PRESENT DISCLOSURE

Embodiments of the thermoelectric conversion material of the present disclosure will be described below with reference to the drawings. In the drawings referenced below, the same or corresponding parts are denoted by the same reference numerals and the descriptions thereof are not repeated.

Embodiment 1

A description will be made of the configuration of a thermoelectric conversion material according to Embodiment 1 of the present disclosure. FIG. 1 is a schematic cross-sectional view showing a portion of a thermoelectric conversion material according to Embodiment 1 of the present disclosure. Referring to FIG. 1, the thermoelectric conversion material 11 according to Embodiment 1 of the present disclosure is disposed on a main surface 13 of a substrate, specifically a sapphire substrate 12, for example. The thermoelectric conversion material 11 contains a constituent element and an additive element that differs by 1 in the number of electrons in its outermost shell relative to the constituent element. In the present embodiment, the thermoelectric conversion material 11 is composed of a semiconductor that contains a plurality of constituent elements. Specifically, the plurality of constituent elements contained in the semiconductor include Si as a first constituent element and Ge as a second constituent element. In the present embodiment, the thermoelectric conversion material 11 contains P as the additive element. That is, in the present embodiment, the constituent elements are Si and Ge, and the additive element is P. Si and Ge each have a difference of 1 in the number of electrons in the outermost shell from P. The additive element, P, has a concentration of not less than 0.01 at % and not more than 30 at %.

The thermoelectric conversion material 11 includes an amorphous phase 14 and a crystal phase 15. The thermoelectric conversion material 11 includes a plurality of crystal phases 15 in granular form. The crystal phases 15 are dispersed in the amorphous phase 14. The crystal phase 15 exists in a state of microcrystals dispersed in the amorphous phase 14. That is, the microstructure of the semiconductor constituting the thermoelectric conversion material 11 includes the amorphous phase 14 and a plurality of granular crystal phases 15 dispersed in the amorphous phase 14.

The grains of the crystal phases 15 have an average grain size of about 7 nm to about 10 nm, for example. With the presence of the crystal phases 15 of such a grain size dispersed in the amorphous phase 14, the thermoelectric conversion material 11 has a high electrical conductivity. The grain size of the crystal phase 15, i.e., the diameter of the grain of the crystal phase 15 can be measured from a TEM image taken of the thermoelectric conversion material. Specifically, the grain diameter is measured by observing a high-resolution transmission electron microscopy (TEM) image obtained with a field emission transmission electron microscope (apparatus name: JEM-2100F (manufactured by JEOL Ltd.)) after slicing the material to approximately 100 mu with focused ion beam (FIB) in the stacking direction.

Figure 2:
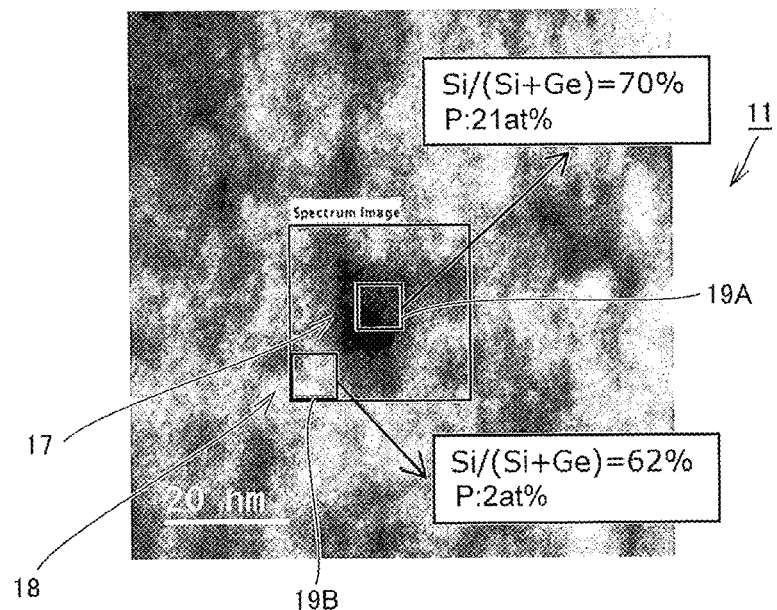
FIG. 2 is a TEM image of a portion of the thermoelectric conversion material according to Embodiment 1.

FIG. 2 is a TEM image of a portion of the thermoelectric conversion material according to Embodiment 1. FIG. 2 shows a cross section of the thermoelectric conversion material 11 within a field of view range of 100 nm$^2$. Referring to FIG. 2 as well, in the thermoelectric conversion material 11 in Embodiment 1, the amorphous phase 14 includes a first region 17 in which the concentration of the additive element is a first concentration, and a second region 18 in which the concentration of the additive element is a second concentration that is lower than the first concentration. The difference between the first concentration and the second concentration is not less than 15 at % and not more than 25 at %. In FIG. 2, the first region 17 is shown darker than the second region 18. The first concentration, i.e. the concentration of P as the additive element in a region 19A in the first region 17, is 21 at %. The second concentration, i.e. the concentration of P as the additive element in a region 19B in the second region 18, is 2 at %. The difference between the first concentration and the second concentration is 19 at %. In other words, the difference between the concentration of the additive element in the first region 17 and the concentration of the additive element in the second region 18 is 19 at %. In the present embodiment, the concentration of P in the first region 17 is higher than the concentration of P in the second region 18. The first region 17 has an equivalent circle diameter of not less than 3 nm and not more than 40 nm. The equivalent circle diameter of the first region 17 means, in the case shown in FIG. 2, a length corresponding to the diameter of the circle when assuming a perfect circle having the same area as the first region 17.

The difference between the ratio of the concentration of atoms of the first constituent element to all the constituent elements in the first region 17 and the ratio of the concentration of atoms of the first constituent element to all the constituent elements in the second region 18 is not less than 5% and not more than 10%. In Embodiment 1, the ratio of the concentration of atoms of the first constituent element to all the constituent elements in the first region 17 is 70%. Specifically, in the first region 17, the ratio of the concentration of Si atoms to the sum of Si and Ge atoms is 70%. The ratio of the concentration of atoms of the first constituent element to all the constituent elements in the second region 18 is 62%. That is, in the second region 18, the ratio of the concentration of Si atoms to the sum of Si and Ge atoms is 62%. The difference between the ratio of the concentration of Si atoms in the first region 17 and the ratio of the concentration of Si atoms in the second region 18 is 8%.

A method of producing the thermoelectric conversion material 11 according to Embodiment 1 will now be described. As a base substrate, a substrate having a main surface, for example a sapphire substrate 12 having a main surface 13, is prepared. Next, with the temperature of the main surface 13 being set at 200 K or lower, a plurality of constituent elements and additive element are vapor-deposited on the main surface to form an amorphous layer composed of a semiconductor. In this case, for example, a molecular beam epitaxy (MBE) method is used to irradiate the raw material elements onto the main surface 13 until a predetermined thickness is reached. Next, the amorphous layer is heated to form granular crystal phases 15 having an average grain size of about 7 nm or more and about 10 nm or less in the amorphous phase. The heating of the amorphous layer also causes cohesion of the additive element in the amorphous phase 14, whereby the first region 17 is formed. In this case, for example, the sapphire substrate 12 is heated to a predetermined temperature and is maintained at the temperature for a predetermined period of time. In this manner, the thermoelectric conversion material according to Embodiment 1 is obtained.

As a specific example, Si, Ge, and P are irradiated simultaneously onto the main surface 13 at a ratio of 11.2 nm/min, 0.6 nm/min, and 0.1 nm/1 min, respectively. An amorphous layer having a total thickness of 200 nm or more is vapor-deposited on the main surface 13 of the sapphire substrate 12, thereby forming a film. The obtained product is subjected to heat treatment of, for example, heating it to 900° C. and holding it for 5 to 30 minutes.

Samples of the thermoelectric conversion material 11 produced under the above conditions were investigated for their properties. The thermoelectric properties were measured using a device for measuring thermophysical properties of thin films (PicoTR manufactured by PicoTherm Corporation). On the front surfaces of the samples, molybdenum (Mo) was sputtered 100 nm, and the measurement was conducted using a front heating/front detection method. The laser pulse for heating was set at 10 kHz. The thermal conductivity was derived by fitting a theoretical formula to the obtained time waveform of reflectance. The measurement was made with a thermoelectric property measuring device (RZ2001i manufactured by Ozawa Science Co., Ltd.) Further, the composition of the thermoelectric conversion material 11, i.e. the concentration of Si atoms, the concentration of Ge atoms, and the concentration of P atoms, was determined using a STEM energy dispersive X-ray spectrometry (STEM/EDX) device (JEM-2100F (manufactured by JEOL Ltd.)) The measurement was conducted under the conditions of the acceleration voltage of 200 kV in the field of view of 100 nm square.

Figure 3:
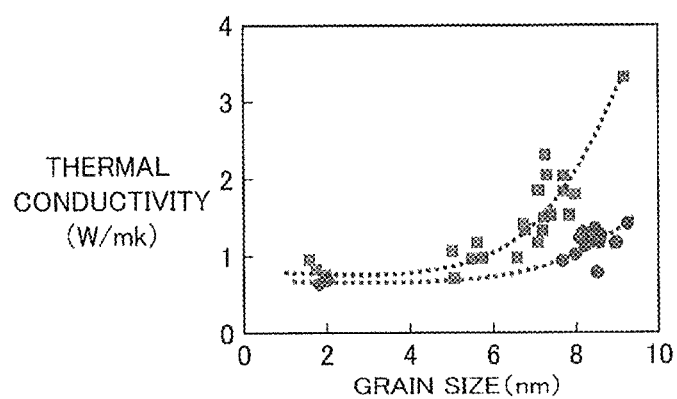
FIG. 3 is a graph showing a relationship between a grain size of a crystal phase and thermal conductivity.

FIG. 3 is a graph showing a relationship between the grain size of the crystal phase and thermal conductivity. The horizontal axis represents grain size (nm) and the vertical axis represents thermal conductivity (W/mK). In FIG. 3, circles indicate the values for the thermoelectric conversion material that includes the first and second regions, and squares indicate the values for a thermoelectric conversion material that was produced with no P added.

Referring to FIG. 3, in the case where the grain size of the crystal phase is small, there is not much difference in the thermal conductivity. However, with a large grain size of the crystal phase, a large difference in thermal conductivity is observed. Specifically, for the thermoelectric conversion material produced without adding P, as indicated by the squares, the thermal conductivity increases with increasing grain size of the crystal phase. For example, when the grain size of the crystal phase becomes about 7 nm, the thermal conductivity increases to about 2 W/mK. When the grain size of the crystal phase becomes about 9 nm, the thermal conductivity becomes larger than 3 W/mK. In contrast, for the thermoelectric conversion material produced with the above-described producing method, as indicated by the circles, the increase in thermal conductivity is suppressed even when the grain size of the crystal phase becomes large. Even with the grain size of the crystal phase of about 8 nm, the thermal conductivity is about 1 W/mK. Even when the grain size of the crystal phase becomes about 9 nm, the thermal conductivity shows a very low value of about 1 W/mK.

Figure 4:
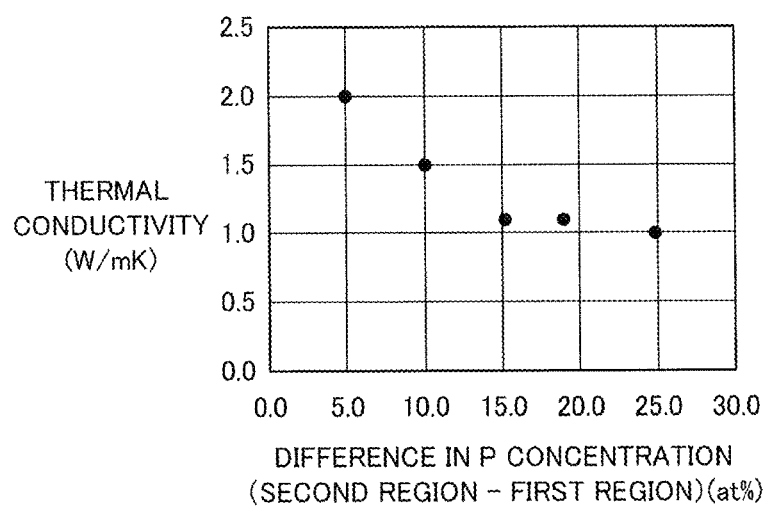
FIG. 4 is a graph showing a relationship between a difference in concentration of an additive element in first and second regions and thermal conductivity.

FIG. 4 is a graph showing a relationship between a difference in concentration of the additive element in the first and second regions and thermal conductivity. In FIG. 4, the horizontal axis represents difference in concentration between the first and second regions (at %) and the vertical axis represents thermal conductivity (W/mK). FIG. 4 shows the case where the grain size of the crystal phase in the thermoelectric conversion material is from 7 nm to 10 nm. FIG. 4 shows values for samples 1, 2, 3, 4, and 5 measured. Table 1 shows, for each of the samples 1, 2, 3, 4, and 5, a first concentration of the additive element (P) in the first region, a second concentration of the additive element (P) in the second region, a difference in concentration (difference) obtained by subtracting the second concentration from the first concentration, and thermal conductivity.

TABLE 1

|  | Sample 1 | Sample 2 | Sample 3 | Sample 4 | Sample 5 |
| --- | --- | --- | --- | --- | --- |
| High Concentration of P (First Concentration) (at %) | 5.6 | 10.8 | 16.2 | 21.1 | 29.8 |
| Low Concentration of P (Second Concentration) (at %) | 0.7 | 0.8 | 1.1 | 2.2 | 5.0 |
| Difference in Concentration (Difference) (at %) | 4.9 | 10.0 | 15.1 | 18.9 | 24.8 |
| Thermal Conductivity (W/mK) | 2.0 | 1.5 | 1.1 | 1.1 | 1.0 |

Referring to FIG. 4 and Table 1, in the case where the grain size of the crystal phase is about 7 nm to about 10 nm, the thermal conductivity is about 2 W/mK when the difference in concentration of the additive element between the first and second regions is about 5% and there is almost no concentration difference. As the concentration difference becomes larger, the thermal conductivity becomes smaller. When the concentration difference is 15 at % or more, the thermal conductivity shows a very small value of about 1 W/mK. This trend continues until the concentration difference reaches 25%. In other words, the thermal conductivity becomes a very small value if the concentration difference is 15 at % or more and 25 at % or less. This is conceivably because the phonon scattering caused by the unevenness in composition of the additive element, P, in the microstructure of the semiconductor, SiGe, has made the thermal conductivity small.

Accordingly, the thermoelectric conversion material of the present disclosure can reduce the thermal conductivity while maintaining the improvement of the electrical conductivity by virtue of the inclusion of the granular crystal phases. Therefore, the thermoelectric conversion material described above can improve the efficiency of thermoelectric conversion.

In the thermoelectric conversion material described above, the difference between the ratio of the concentration of atoms of the first constituent element to all the constituent elements in the first region and the ratio of the concentration of atoms of the first constituent element to all the constituent elements in the second region is not less than 5% and not more than 10%. Accordingly, the thermoelectric conversion material has a reduced thermal conductivity because of the phonon scattering caused by the unevenness in composition of the constituent elements in the microstructure of the semiconductor. The material is therefore a thermoelectric conversion material that can improve the efficiency of thermoelectric conversion.

In the thermoelectric conversion material described above, the equivalent circle diameter of the first region 17 is not less than 3 nm and not more than 40 nm. Accordingly, the above-described thermoelectric conversion material is a thermoelectric conversion material that reliably enables reduction of the thermal conductivity while maintaining a high electrical conductivity. The material is therefore a thermoelectric conversion material that can reliably improve the efficiency of thermoelectric conversion.

While the additive element is P in the thermoelectric conversion material 11, not limited thereto, the additive element may include at least one of Sb, Al, P, As, and N. Such an additive element is suitably used as the additive element for the above-described constituent elements.

While the constituent element includes Si and Ge in the above-described embodiment, not limited thereto, the constituent element in the thermoelectric conversion material 11 may include at least one of Si and Ge. Such a constituent element is suitable as the constituent element for the thermoelectric conversion material. Specifically, the semiconductor may be composed of Si alone.

In the thermoelectric conversion material described above, the concentration of the additive element may be not less than 5 at % and not more than 25 at %. With this, a thermoelectric conversion material improved in thermoelectric conversion efficiency can be obtained more reliably.

Accordingly, the thermoelectric conversion material of the present disclosure can reduce the thermal conductivity while maintaining the improvement of the electrical conductivity by virtue of the inclusion of the granular crystal phases. Therefore, the above-described thermoelectric conversion material can improve the efficiency of thermoelectric conversion.

In the thermoelectric conversion material described above, the difference between the ratio of the concentration of atoms of the first constituent element to all the constituent elements in the first region and the ratio of the concentration of atoms of the first constituent element to all the constituent elements in the second region is not less than 5% and not more than 10%. Accordingly, the thermoelectric conversion material has a reduced thermal conductivity because of the phonon scattering caused by the unevenness in composition of the constituent elements in the microstructure of the semiconductor. The material is therefore a thermoelectric conversion material that can improve the efficiency of thermoelectric conversion.

In the thermoelectric conversion material described above, the equivalent circle diameter of the first region 17 is not less than 3 nm and not more than 40 nm. Accordingly, the above-described thermoelectric conversion material is a thermoelectric conversion material that reliably enables reduction of the thermal conductivity while maintaining a high electrical conductivity. The material is therefore a thermoelectric conversion material that can reliably improve the efficiency of thermoelectric conversion.

While the additive element is P in the thermoelectric conversion material 11, not limited thereto, the additive element may include at least one of Sb, Al, P. As, and N. Such an additive element is suitably used as the additive element for the above-described constituent elements.

While the constituent element includes Si and Ge in the above-described embodiment, not limited thereto, the constituent element in the thermoelectric conversion material 11 may include at least one of Si and Ge. Such a constituent element is suitable as the constituent element for the thermoelectric conversion material. Specifically, the semiconductor may be composed of Si alone.

In the thermoelectric conversion material described above, the concentration of the additive element may be not less than 5 at % and not more than 25 at %. With this, a thermoelectric conversion material improved in thermoelectric conversion efficiency can be obtained more reliably.

Embodiment 2

A description will now be made of a power generation element and a power generation module as an embodiment of a thermoelectric conversion element and a thermoelectric conversion module using the thermoelectric conversion material according to Embodiment 1 of the present disclosure.

Figure 5:
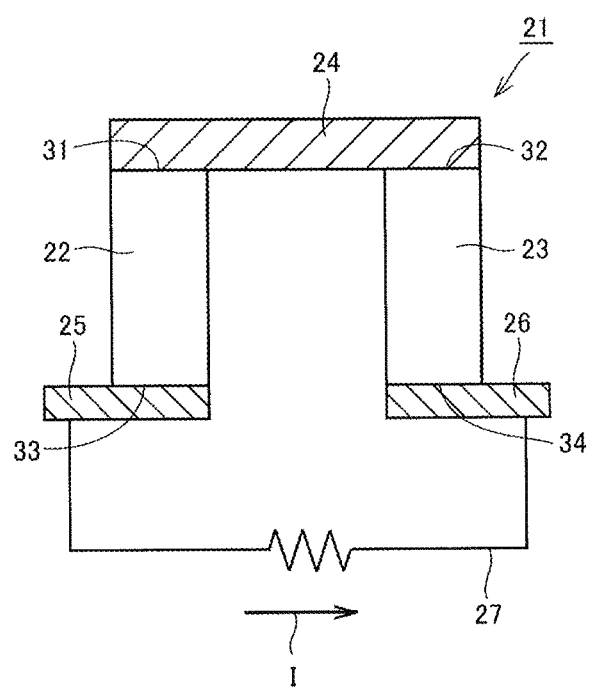
FIG. 5 is a schematic diagram showing the structure of a $\pi$ type thermoelectric conversion element (power generation element), which is a thermoelectric conversion element.

FIG. 5 is a schematic diagram showing the structure of a π type thermoelectric conversion element (power generation element) 21, which is the thermoelectric conversion element in Embodiment 2. Referring to FIG. 5, the π type thermoelectric conversion element 21 includes a p type thermoelectric conversion material portion 22 as a first thermoelectric conversion material portion, an n type thermoelectric conversion material portion 23 as a second thermoelectric conversion material portion, a high temperature side electrode 24, a first low temperature side electrode 25, a second low temperature side electrode 26, and a wire 27.

The material constituting the p type thermoelectric conversion material portion 22 is the thermoelectric conversion material of Embodiment 1 having p type conductivity, for example. The material constituting the n type thermoelectric conversion material portion 23 is the thermoelectric conversion material of Embodiment 1 having n type conductivity, for example.

The p type thermoelectric conversion material portion 22 and the n type thermoelectric conversion material portion 23 are disposed side by side with a spacing therebetween. The high temperature side electrode 24 is disposed to extend from one end 31 of the p type thermoelectric conversion material portion 22 to one end 32 of the n type thermoelectric conversion material portion 23. The high temperature side electrode 24 is disposed so as to contact both the one end 31 of the p type thermoelectric conversion material portion 22 and the one end 32 of the n type thermoelectric conversion material portion 23. The high temperature side electrode 24 is disposed to connect the one end 31 of the p type thermoelectric conversion material portion 22 and the one end 32 of the n type thermoelectric conversion material portion 23. The high temperature side electrode 24 is composed of an electrically conductive material, such as a metal. The high temperature side electrode 24 is in ohmic contact with the p type thermoelectric conversion material portion 22 and the n type thermoelectric conversion material portion 23.

Although it is desirable that the thermoelectric conversion material portion 22 or the thermoelectric conversion material portion 23 has p type or n type, either of them may be a metal conductor.

The first low temperature side electrode 25 is disposed in contact with another end 33 of the p type thermoelectric conversion material portion 22. The first low temperature side electrode 25 is disposed apart from the high temperature side electrode 24. The first low temperature side electrode 25 is composed of an electrically conductive material, such as a metal. The first low temperature side electrode 25 is in ohmic contact with the p type thermoelectric conversion material portion 22.

The second low temperature side electrode 26 is disposed in contact with another end 34 of the n type thermoelectric conversion material portion 23. The second low temperature side electrode 26 is disposed apart from the high temperature side electrode 24 and the first low temperature side electrode 25. The second low temperature side electrode 26 is composed of an electrically conductive material, such as a metal. The second low temperature side electrode 26 is in ohmic contact with the n type thermoelectric conversion material portion 23.

The wire 27 is composed of an electric conductor such as a metal. The wire 27 electrically connects the first low temperature side electrode 35 and the second low temperature side electrode 26.

In the π type thermoelectric conversion element 21, when a temperature difference is formed so that the one end 31 side of the p type thermoelectric conversion material portion 22 and the one end 32 side of the n type thermoelectric conversion material portion 23 are at a high temperature and the other end 33 side of the p type thermoelectric conversion material portion 22 and the other end 34 side of the n type thermoelectric conversion material portion 23 are at a low temperature, for example, then p type carriers (holes) move from the one end 31 side toward the other end 33 side in the p type thermoelectric conversion material portion 22. At this time, in the n type thermoelectric conversion material portion 23, n type carriers (electrons) move from the one end 32 side toward the other end 34 side. As a result, a current flows through the wire 27 in the direction of the arrow 1. In this manner, power generation by thermoelectric conversion using a temperature difference is achieved in the π type thermoelectric conversion element 21. In other words, the π type thermoelectric conversion element 21 is a power generation element.

As the materials constituting the p type thermoelectric conversion material portion 22 and the n type thermoelectric conversion material portion 23, the thermoelectric conversion material 11 of Embodiment 1, having an increased value of ZT with the decreased thermal conductivity, is adopted. As a result, the π type thermoelectric conversion element 21 is a highly efficient power generation element.

While the π type thermoelectric conversion element has been described as an example of the thermoelectric conversion element of the present disclosure in the above embodiment, the thermoelectric conversion element of the present disclosure is not limited thereto. The thermoelectric conversion element of the present disclosure may be a thermoelectric conversion element having another structure, such as an I type (unileg) thermoelectric conversion element, for example.

A plurality of π type thermoelectric conversion elements 21 can be electrically connected to obtain a power generation module as the thermoelectric conversion module. A power generation module 41, the thermoelectric conversion module of the present embodiment, has a structure in which a plurality of π type thermoelectric conversion elements 21 are connected in series.

Figure 6:
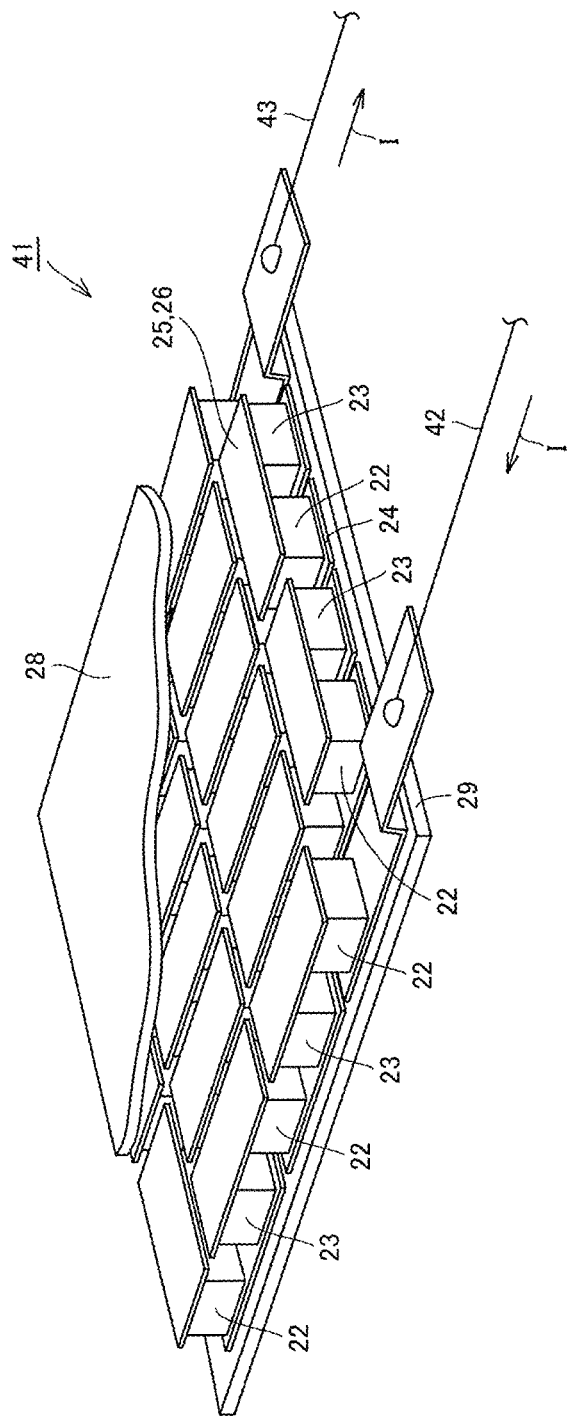
FIG. 6 shows an exemplary structure of a power generation module.

FIG. 6 shows an exemplary structure of the power generation module 41. Referring to FIG. 6, the power generation module 41 of the present embodiment includes p type thermoelectric conversion material portions 22, n type thermoelectric conversion material portions 23, low temperature side electrodes 25, 26 each corresponding to the first and second low temperature side electrodes 25 and 26, high temperature side electrodes 24, a low temperature side insulator substrate 28, and a high temperature side insulator substrate 29. The low temperature side insulator substrate 28 and the high temperature side insulator substrate 29 are composed of a ceramic such as alumina. The p type thermoelectric conversion material portions 22 and the n type thermoelectric conversion material portions 23 are arranged alternately side by side. A low temperature side electrode 25, 26 is disposed in contact with a p type thermoelectric conversion material portion 22 and an n type thermoelectric conversion material portion 23, as in the above-described n type thermoelectric conversion element 21. A high temperature side electrode 24 is disposed in contact with a p type thermoelectric conversion material portion 22 and an n type thermoelectric conversion material portion 23, as in the above-described π type thermoelectric conversion element 21. A p type thermoelectric conversion material portion 22 is connected to an adjacent n type thermoelectric conversion material portion 23 on one side via a common high temperature side electrode 24. This p type thermoelectric conversion material portion 22 is also connected to an adjacent n type thermoelectric conversion material portion 23 on a side different from the above one side via a common low temperature side electrode 25, 26. In this manner, all the p type thermoelectric conversion material portions 22 and n type thermoelectric conversion material portions 23 are connected in series.

The low temperature side insulator substrate 28 is disposed on a main surface side of the plate-shaped low temperature side electrodes 25, 26 opposite to the side on which they contact the p type thermoelectric conversion material portions 22 and the n type thermoelectric conversion material portions 23. One low temperature side insulator substrate 28 is disposed for the plurality of (all the) low temperature side electrodes 25, 26. The high temperature side insulator substrate 29 is disposed on a side of the plate-shaped high temperature side electrodes 24 opposite to the side on which they contact the p type thermoelectric conversion material portions 22 and the n type thermoelectric conversion material portions 23. One high temperature side insulator substrate 29 is disposed for the plurality of (all the) high temperature side electrodes 24.

Wires 42 and 43 are each connected to the high temperature side electrode 24 or the low temperature side electrode 25, 26 that is in contact with the p type thermoelectric conversion material portion 22 or the n type thermoelectric conversion material portion 23 located at a respective end of the series-connected p type thermoelectric conversion material portions 22 and n type thermoelectric conversion material portions 23. When a temperature difference is formed so that the high temperature side insulator substrate 29 side attains a high temperature and the low temperature side insulator substrate 28 side attains a low temperature, then the series-connected p type thermoelectric conversion material portions 22 and n type thermoelectric conversion material portions 23 permit a current to flow in the directions of the arrows I, as in the case of the π type thermoelectric conversion element 21 described above. In this manner, power generation by thermoelectric conversion using a temperature difference is achieved in the power generation module 41.

Embodiment 3

A description will now be made of an infrared sensor, which is an optical sensor, as another embodiment of the thermoelectric conversion element using the thermoelectric conversion material according to Embodiment 1.

Figure 7:
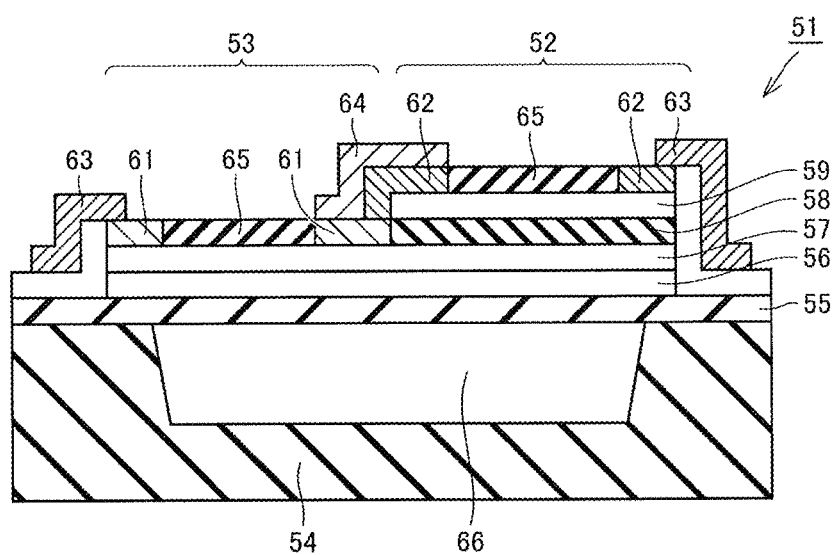
FIG. 7 shows an exemplary structure of an infrared sensor.

FIG. 7 shows an exemplary structure of an infrared sensor 51. Referring to FIG. 7, the infrared sensor 51 includes a p type thermoelectric conversion portion 52 and an a type thermoelectric conversion portion 53 disposed adjacent to each other. The p type thermoelectric conversion portion 52 and the n type thermoelectric conversion portion 53 are formed on a substrate 54.

The infrared sensor 51 includes the substrate 54, an etching stop layer 55, an n type thermoelectric conversion material layer 56, an $n^+$ type ohmic contact layer 57, an insulator layer 58, a p type thermoelectric conversion material layer 59, n side ohmic contact electrodes 61, p side ohmic contact electrodes 62, a heat absorption pad 63, an absorber 64, and a protective film 65.

The substrate 54 is composed of an insulator such as silicon dioxide. The substrate 54 has a recess 66 formed therein. The etching stop layer 55 is formed to cover a surface of the substrate 54. The etching stop layer 55 is composed of an insulator such as silicon nitride, for example. A gap is formed between the etching stop layer 55 and the recess 66 of the substrate 54.

The n type thermoelectric conversion material layer 56 is formed on a main surface of the etching stop layer 55 opposite to the substrate 54. The material constituting the n type thermoelectric conversion material layer 56 is the thermoelectric conversion material of Embodiment 1 having n type conductivity, for example. The $n^+$ type ohmic contact layer 57 is formed on a main surface of the n type thermoelectric conversion material layer 56 opposite to the etching stop layer 55. The $n^+$ type ohmic contact layer 57 is doped, at a high concentration, with n type impurities that cause the generation of n type carriers (electrons) as majority carriers, for example. Thus, the $n^+$ type ohmic contact layer 57 has n type conductivity.

The n side ohmic contact electrode 61 is disposed to contact a central portion of a main surface of the $n^+$ type ohmic contact layer 57 opposite to the n type thermoelectric conversion material layer 56. The n side ohmic contact electrode 61 is composed of a material that can make ohmic contact with the $n^+$ type ohmic contact layer 57, such as a metal. The insulator layer 58, composed of an insulator such as silicon dioxide, for example, is disposed on the main surface of the $n^+$ type ohmic contact layer 57 opposite to the n type thermoelectric conversion material layer 56. The insulator layer 58 is disposed on the main surface of the n type ohmic contact layer 57 on the p type thermoelectric conversion portion 52 side with respect to the n side ohmic contact electrode 61.

The protective film 65 is also disposed on the main surface of the n⁺ type ohmic contact layer 57 opposite to the n type thermoelectric conversion material layer 56. The protective film 65 is disposed on the main surface of the n⁺ type ohmic contact layer 57 on the opposite side from the p type thermoelectric conversion portion 52 side with respect to the n side ohmic contact electrode 61. On the main surface of the n; type ohmic contact layer 57 opposite to the n type thermoelectric conversion material layer 56, another n side ohmic contact electrode 61 is disposed on the opposite side from the above-described n side ohmic contact electrode 61, with the protective film 65 sandwiched therebetween.

The p type thermoelectric conversion material layer 59 is disposed on a main surface of the insulator layer 58 opposite to the n⁺ type ohmic contact layer 57. The material constituting the p type thermoelectric conversion material layer 59 is the thermoelectric conversion material of Embodiment 1 having p type conductivity, for example.

The protective film 65 is disposed at a central portion on a main surface of the p type thermoelectric conversion material layer 59 opposite to the insulator layer 58. On the main surface of the p type thermoelectric conversion material layer 59 opposite to the insulator layer 58, a pair of p side ohmic contact electrodes 62 are disposed sandwiching the protective film 65 therebetween. The p side ohmic contact electrodes 62 are composed of a material that can make ohmic contact with the p type thermoelectric conversion material layer 59, such as a metal. Of the pair of p side ohmic contact electrodes 62, the p side ohmic contact electrode 62 on the n type thermoelectric conversion portion 53 side is connected to the n side ohmic contact electrode 61.

The absorber 64 is disposed to cover main surfaces of the mutually connected p side ohmic contact electrode 61 and n side ohmic contact electrode 62 opposite to the n⁺ type ohmic contact layer 57. The absorber 64 is composed of titanium, for example. The heat absorption pad 63 is disposed to be in contact with the top surface of the p side ohmic contact electrode 61 that is not connected to the n side ohmic contact electrode 62. The heat absorption pad 63 is also disposed to be in contact with the top surface of the n side ohmic contact electrode 62 that is not connected to the p side ohmic contact electrode 61. As a material constituting the heat absorption pad 63, gold (Au)/titanium (Ti), for example, is adopted. That is, the absorber 64 and the n type thermoelectric conversion material layer 56 are thermally connected to each other. The absorber 64 and the p type thermoelectric conversion material layer 59 are thermally connected to each other.

When the infrared sensor 51 is irradiated with infrared rays, the absorber 64 absorbs the energy of the infrared rays. As a result, the temperature of the absorber 64 rises. On the other hand, the temperature rise of the heat absorption pad 63 is suppressed. This forms a temperature difference between the absorber 64 and the heat absorption pad 63. Accordingly, in the p type thermoelectric conversion material layer 59, p type carriers (holes) move from the absorber 64 side toward the heat absorption pad 63 side. On the other hand, in the n type thermoelectric conversion material layer 56, n type carriers (electrons) move from the absorber 64 side toward the heat absorption pad 63 side. Then, by extracting a current generated as a result of the migration of the carriers from the n side ohmic contact electrodes 61 and the p side ohmic contact electrodes 62, the infrared rays are detected.

In the infrared sensor 51 of the present embodiment, as the materials constituting the p type thermoelectric conversion material layer 59 and the n type thermoelectric conversion material layer 56, the thermoelectric conversion material of Embodiment 1 having an increased value of ZT with the decreased thermal conductivity is adopted. As a result, the infrared sensor 51 is a high-sensitivity infrared sensor.

It should be understood that the embodiments disclosed herein are illustrative and non-restrictive in every respect. The scope of the present disclosure is defined by the terms of the claims, rather than the description above, and is intended to include any modifications within the scope and meaning equivalent to the terms of the claims.

DESCRIPTION OF REFERENCE NUMERALS 11 thermoelectric conversion material
12 sapphire substrate
13 main surface
14 amorphous phase
15 crystal phase
17 first region
18 second region
19A, 19B region
21 π type thermoelectric conversion element
22, 52 p type thermoelectric conversion material portion
23, 53 n type thermoelectric conversion material portion
24 high temperature side electrode
25 first low temperature side electrode (low temperature side electrode)
26 second low temperature side electrode (low temperature side electrode)
27, 42, 43 wire
28 low temperature side insulator substrate
29 high temperature side insulator substrate
31, 32, 33, 34 end
41 thermoelectric conversion module
51 infrared sensor
54 substrate
55 etching stop layer
56 n type thermoelectric conversion material layer
57 n⁺ type ohmic contact layer
58 insulator layer
59 p type thermoelectric conversion material layer
61 n side ohmic contact electrode
62 p side ohmic contact electrode
63 heat absorption pad
64 absorber
65 protective film
66 recess
I arrow

The invention claimed is:

1. A thermoelectric conversion material constituted of a semiconductor containing a constituent element and an additive element having a difference of 1 in the number of electrons in an outermost shell from the constituent element, the additive element having a concentration of not less than 0.01 at % and not more than 30 at %,
   the semiconductor having a microstructure including
      an amorphous phase, and
      a granular crystal phase dispersed in the amorphous phase, the amorphous phase including
         a first region in which the concentration of the additive element is a first concentration, and a second region in which the concentration of the additive element is a second concentration lower than the first concentration, the first concentration and the second concentration having a difference of not less than 15 at % and not more than 25 at % therebetween.

2. The thermoelectric conversion material according to claim 1, wherein the constituent element includes
a first constituent element and
a second constituent element, and a ratio of a concentration of atoms of the first constituent element to all the constituent elements in the first region and a ratio of a concentration of atoms of the first constituent element to all the constituent elements in the second region have a difference of not less than 5% and not more than 10% therebetween.

3. The thermoelectric conversion material according to claim 1, wherein the first region has an equivalent circle diameter of not less than 3 nm and not more than 40 nm.

4. The thermoelectric conversion material according to claim 1, wherein the constituent element includes at least one of Si and Ge.

5. The thermoelectric conversion material according to claim 4, wherein the additive element includes at least one of Sb, Al, P, As, and N.

6. The thermoelectric conversion material according to claim 1, wherein the concentration of the additive element is not less than 5 at % and not more than 25 at %.

7. A thermoelectric conversion element comprising:
a thermoelectric conversion material portion;
a first electrode disposed in contact with the thermoelectric conversion material portion; and
a second electrode disposed in contact with the thermoelectric conversion material portion and apart from the first electrode;
the thermoelectric conversion material portion being constituted by the thermoelectric conversion material according to claim 1 having p type or n type conductivity.

8. A thermoelectric conversion module comprising the thermoelectric conversion element according to claim 7.

9. An optical sensor comprising:
an absorber that absorbs optical energy; and
a thermoelectric conversion material portion connected to the absorber,
the thermoelectric conversion material portion being constituted by the thermoelectric conversion material according to claim 1 having p type or n type conductivity.

* * * * *